United States Patent [19]

Muzyczko et al.

[11] 4,046,577

[45] * Sept. 6, 1977

[54] PHOTOREACTIVE COMPOSITIONS COMPRISING POLYMERS CONTAINING ALKOXYAROMATIC GLYOXY GROUPS

[75] Inventors: Thaddeus M. Muzyczko, Downers Grove; Thomas H. Jones, Naperville, both of Ill.

[73] Assignee: The Richardson Company, Des Plaines, Ill.

[*] Notice: The portion of the term of this patent subsequent to July 13, 1993, has been disclaimed.

[21] Appl. No.: 704,384

[22] Filed: July 12, 1976

Related U.S. Application Data

[60] Continuation-in-part of Ser. No. 585,215, June 9, 1975, Pat. No. 3,969,119, which is a division of Ser. No. 267,475, June 29, 1972, Pat. No. 3,888,671.

[51] Int. Cl.² .................. G03C 1/68; G03F 7/02; G03C 5/00
[52] U.S. Cl. ..................... 96/115 R; 96/33; 96/35.1; 96/36; 96/36.2; 96/36.3; 96/86 P; 96/115 P; 204/159.14; 101/456
[58] Field of Search .......... 96/115 R, 115 P, 33, 96/86 P, 36, 36.2, 36.3, 35.1; 101/456; 204/159.14, 159.15, 159.19, 159.22; 260/31.4, 31.6

[56] References Cited

U.S. PATENT DOCUMENTS

| 2,824,084 | 2/1958  | Unruh et al. ............... 96/115 R |
| 2,824,087 | 2/1958  | Sagura et al. ............... 96/115 R |
| 3,475,176 | 10/1969 | Rauner ....................... 96/115 R |
| 3,556,792 | 1/1971  | Katz .......................... 96/115 R |
| 3,556,793 | 1/1971  | Field et al. ................. 96/115 R |
| 3,969,119 | 7/1976  | Muzyczko et al. .......... 96/115 R |

*Primary Examiner*—Edward C. Kimlin
*Attorney, Agent, or Firm*—Alan M. Abrams

[57] ABSTRACT

A photoreactive composition containing an effective amount of a polymer which includes as a recurring structure:

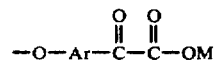

wherein Ar is a bivalent aromatic radical, and M is selected from the class consisting of hydrogen, alkali metal, ammonium, and substituted ammonium. These compositions are useful in a wide variety of photochemical and photomechanical processes and are particularly suited for use as photopolymers, photoinitiators and photosensitizers in light sensitive coatings of presensitized lithographic plates.

63 Claims, No Drawings

PHOTOREACTIVE COMPOSITIONS COMPRISING POLYMERS CONTAINING ALKOXYAROMATIC GLYOXY GROUPS

BACKGROUND AND DESCRIPTION OF THE INVENTION

This application is a continuation-in-part of our prior copending application Ser. No. 585,215, filed June 9, 1975, now U.S. Pat. No. 3,969,119, which in turn, was a division of our application Ser. No. 267,475, filed June 29, 1972, now U.S. Pat. No. 3,888,671.

This invention generally relates to novel photosensitive compositions which are useful in a wide variety of photochemical processes such as, for example, planographic, letter-press, gravure and silk screen printing processes as well as photomechanical processes such as, for example, the production of printed circuits, chemical milling and chemical etching. An important aspect of the present invention is directed to novel photoreactive compositions which are especially suitable for use as photopolymers, photoinitiators and photosensitizers in light sensitive coatings used in lithographic plates.

In commercial lithography, a light sensitive coating on a backing member is generally subjected to a controlled light exposure and thereafter developed to provide an image area which is insoluble in a particular solvent and a non-image area which is soluble in that solvent. Typically, the image area is grease-receptive and water repellent, while the non-image area is water-receptive and grease-repellant. Oil-based inks therefore adhere only to the image area, from which they can be transferred to a surface in a suitable printing operation such as, for example, by offset printing.

Early lithographic plates typically had light sensitive surface coatings which generally contained bichromated colloids such as bichromated albumin that underwent a sol-gel transformation upon being subjected to light. Since these bichromated colloids are sensitive to moisture, they deteriorate rapidly on being subjected to atmospheric conditions and their use has been generally limited to so-called wipe-on plates, that is, systems wherein the light sensitive bichromated coating is applied to the plate or backing member immediately prior to its being exposed to light.

Subsequently, light sensitive diazo, compounds have been used as the light sensitive coating in presensitized lithographic plates, namely, plates which have the light sensitized diazo coating applied thereto prior to actual use. While diazosensitized plates are extensively commercially used at this time, they are characterized by certain disadvantages which include, for example, limited shelf life, and the need for a barrier coating between the diazo coating and the backing member. In addition, the diazo coatings present handling problems by reason of their sensitivity to heat, moisture and tungsten light.

More recently, the efforts to overcome the disadvantages of the above mentioned prior art compositions have involved the use of photopolymer coatings which can be applied to a suitable backing member long prior to actual use and which, upon being subjected to light, become insolubilized by polymerization or crosslinking. These photopolymer coatings have been composed of various materials, for example, the cinnamate ester resins of polyvinyl alcohol and cellulose as well as those based on epoxy resins. Similarly, acrylic coatings and polyamide coatings are other types of photopolymerizable coatings which have been discussed in the prior art.

These known photopolymer coatings, however, often require the addition of photosensitizers and photoinitiators, Also, when used in lithographic plates, these known photopolymer coating have presented relatively difficult manufacturing problems and have required development procedures which are more complex than desired.

It is, therefore, an important object of the present invention to provide a new class of photosensitive compositions characterized by improved photoreactive properties enabling them to be used in a wide variety of photochemical and photomechanical processes.

Another object of the present invention is to provide a new and useful class of photoreactive compositions which are useful in virtually all printing process including planographic, relief, gravure and silk screen printing processes.

Another object of the present invention is to provide a new and useful class of photoreactive compositions which can be used alone, or if desired, in conjunction with a wide variety of resins, both saturated and unsaturated, to provide improved photoreactive coatings.

Another object of the present invention is to provide a class of novel photoreactive compositions which include an effective amount of multi-functional glyoxylated substituents.

Another object of the present invention is to provide a class of photoreactive polymeric compositions advantageously suitable for use as photoinitiators, photosensitizers or photopolymers, which compositions include, as a repeated structure, a plurality of glyoxylated groups, present either wholly or partially as pendant groups from the polymeric chain which exhibit advantageous oxygen insensitivity.

Another object of the present invention is to provide a class of photoreactive compositions suitable for use as photoinitiators, photosensitizers, and photopolymers characterized by long shelf life, enabling them to be particularly suitable for use in presensitized lithographic plates.

Another object of the present invention is to provide a class of photoreactive compositions which can be used alone or in conjunction with a wide variety of resins, to provide photoreactive coatings which are developable with water or alcoholbased solvents or desensitizers.

Another object of the present invention is to provide a class of improved photoreactive compositions which, upon controlled exposure to actinic light, are capable of forming insoluble image areas that exhibit long running characteristics on backing members in lithographic plates.

Another object of the present invention is to provide a class of improved photoreactive compositions which can be used in ink and coating formulations to make such ink and coating formulations photocurable.

These and other objects of the present invention will be apparent to those skilled in the art from reading the following more detailed description.

In accordance with an important aspect of the present invention, novel polymers are provided which are soluble in a suitable solvent, typically an aqueous solvent or an organic solvent such as acetone or methylethyl ketone. These novel polymers, upon exposure to actinic light, photoreact and become insoluble. As such, the polymers of this invention are particularly suitable for use in photoreactive processes including photochemical as well as photomechanical processes and find advantageous use either alone, or in conjunction with other materials, in photoreactive coatings used on lithographic plates.

The novel compositions of this invention generally comprise polymers which include as a recurring structure:

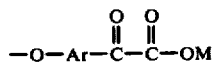

wherein Ar is a bivalent aromatic radical and M is selected from the class consisting of hydrogen, alkali metal, ammonium and substituted ammonium.

In the above formula, the preferred alkali metals in the M group are sodium, potassium and lithium. Corespondingly, the substituted ammonium substituents encompassed by the definition of the M group are those which provide a compound which is water soluble and include, for example, triethylamine, ethylamine, aniline, substituted aniline (e.g. chloroaniline, cyanoaniline and methyoxyaniline), pyridine, substituted pyridine (e.g. picoline and 2,6-lutidine), the alkanolamines such as, for example, mono, di and tri-alkanolamines wherein the alkanol group is ethanol or isopropanol, the alkylamines such as, for example, the mono, di and tri-alkylamines wherein the alkyl group is ethyl or propyl, morpholine and the cycloaliphatic amines such as, for example, cyclohexylamine.

As used herein, the "Ar" group is intended to include all bivalent structures exhibiting aromaticity, including: carbon ring structures such as, for example, phenylene, diphenylene and the like; fused ring structures such as, for example, bivalent derivatives of naphthalene, anthracene, phenanthrene, and the like; and heterocyclic structures such as, for example, bivalent derivatives of pyridine, furan, thiophene, pyrrole, quinoline, indole, and the like. In the preferred embodiment of this invention, however, the "Ar" group is phenylene.

The compositions of the present invention include a polymer having a backbone structure, the chemical nature of which is not critical except in its ability partially incorporate and/or bondably connect with aromaticglyoxy groups generally in accordance with the aforementioned structure. As such, these polymeric backbone structures can be organic, organometallic or inorganic and be in oligomeric or polymeric form. In this regard, it should be noted that the term polymeric is used to include homopolymers and copolymers which are characterized by two or more dissimilar monomeric units and are produced by polymerization, condensation or addition. These copolymers can be in graft, random or alternating from. Examples of suitable backbones include: the aliphatics such as methylene, ethylene and propylene; the aromatics such as phenylene, biphenylene, naphthalene and anthracene; the substituted aromatics such as tolylene, ethylphenylene, aminophenylene, alkoxyphenylenes (e.g. methoxyphenylene), cyanophenylene, hydroxyphenylene, the halophenylens (e.g. chlorophenylene), ethylnapthalene, carboxyphenylene, difunctional derivatives of the phthalates and substituted phthalates such as the hydroxy alkylphthalate compounds (e.g. hydroxyethylphthalate) and acyloxyphenylenes (e.g. acetoxyphenylene); cyclic hydrocarbons such as difunctional derivatives of cyclopentane and cyclohexane; heterocyclics such as difuncitonal derivatives of thiophene and pyrrole; the organometallics such as difunctional derivatives of the metallocenes such as ferrocene and cuprocene; polymeric materials such as the polyalkylenes (e.g. polyethylene, polypropylene and polybutylene); polyesters such as polyethyleneterephthalate and polyethyleneadipate; polyurethanes such as the toluene diisocyanate polyol urethanes; polyamides such as polyhexamethylenedipamide; copolymers such as vinylidene chloride/vinyl chloride copolymers; the polysiloxanes; the polyalkyleneoxides (e.g. polyethylene oxide, polypropylene oxide, polybutylene oxide, polytetramethylene ether and polyepichlorohydrin); the polyalkylene imines such as polyethylenimine and polypropylenimine; substituted polyakylenes such as polyvinylpyrrolidone; and phenolic derivatives such as novolac, resole and polyphenylene oxide.

As previously noted, photoreactive compositions of the present invention can be used alone or in conjunction with other materials to provide photoreactive compositions suitable in a wide variety of photomechanical and photochemical processes. For example, these novel compositions exhibit advantageous utility as photoinitiators with both saturated and unsaturated resins including resins which are not photosensitive in themselves. In particular, durable insoluble photoreaction products have been formed through the conjoint use of the photoreactive compositions of the present invention as photosensitizers with a wide variety of resins, including: the acrylic polymers and acrylic ester resins such as polymethylmethacrylate, polyethylmethacrylate, and copolymers of methyl and butyl methacrylate (e.g. "Elvacite"); polyurethane resins such as those formed by reacting diisocyanates such as, for example, toluene diisocyanate with low molecular weight polyesters or low molecular weight polyethylene glycols (e.g. "Estane" polyurethane resins); blocked urethane resins such as, for example, phenol blocked polyurethane resins (e.g. "Tranco 3A" blocked urethane resins); alkyl celluloses such as ethyl cellulose (e.g. "Hercules K-type" ethyl cellulose); epoxy resins (e.g. "Epon 1004" which is the condensation product formed from bisphenol A and epichlorohydrin); phenoxy resins (e.g. "Bakelite PKHH" phenoxy resin); vinyl acetate/vinyl chloride copolymers (e.g. "Bakelite VYHH" an 86% vinyl chloride, 14% vinyl acetate copolymer medium molecular weight resin); vinyl modified polyethylene such as ethylene/vinyl acetate copolymer containing 2 to 50% vinyl acetate ("Ultrathene" ethylene/vinyl acetate copolymer); partially (5 to 80%) hydrolyzed vinyl acetate resin (e.g. "Bakelite" MA 28-18 18% hydrolyzed vinyl acetate); phenolic resins (e.g. "Plenco 1000" novolac resin); acrylamide and modified acrylamide polymers such as diacetone acrylamide homopolymer, N-methylol acrylamide, N-alkoxymethyl acrylamide and partially hydrolyzed acrylamide; water-soluble cellulose derivatives such as the hydroxyethylated celluloses and hydroxypropyl cellulose (e.g. "Klucel" hydroxypropyl cellulose); and water-soluble polyether resins such as the polyalkylene oxides (e.g. "Polyox WSRN-80" polyethylene oxide).

The amount of the aromaticglyoxy substituted polymers of the present invention which will be used in a given photoreactive composition will vary over a range depending upon the intended function of the compound in the composition. For this reason, the concentration of these constituents in a given photoreactive composition is best described as an "effective amount" and ranges from 0.01% to 100% based on the total weight of reactive materiaL in the composition. For example, when these aromaticglyoxy substituted polymers are used as photointiators in a particular coating composition which includes polymerizable monomers (for example, acrylic or vinyl monomers), the amounts of these compounds will generally range from approximately 0.01% to 10% by weight, based on the total weight of reactive material in the composition. When used as a photopolymer with other resins, whether saturated or unsaturated, however, the amounts of the aromaticgloxy substituted polymers of the present invention can be as low as 5 weight percent and still provide a satisfactory photoreactive coating which, upon being subjected to actinic radiation, forms an insoluble species. However, amounts of aromaticglyoxy substituted polymers of the present invention of at least 50 weight percent are preferred for photoreactive coatings suitable for most end uses. Correspondingly, the novel polymers of the present invention can be used alone, that is, without any other thermoplastic resin, to provide a photoreactive coating composition which can be advantageously employed in virtually all photochemical and photomechanical processes including, in particular, the manufacture of presensitized lithographic plates.

In those emobodiments of the present invention wherein the aromaticglyoxy groups are wholly or partially present as pedant groups from the polymeric chain, the degree of substitution of these glyoxy substituents can best be described as an amount sufficient to provide the polymer with the ability to from an insoluble species upon being subjected to light. Since the acid form of these compounds is preferred in applications wherein these compounds are applied as a solution to a backing or support member, the minimum degree of substitution which is preferred with such embodiments is that amount which will provide an overall composition soluble in the solvent used in such solution. In this regard, the preferred minimum degree of substitution of the acid form of tha aromaticglyoxy group on a polymeric backbone is that amount which provides an overall compound which is soluble in an aqueous alkaline solution.

If desired, known photoactive structures may be used in photoreactive compositions which include the aromaticglyoxy substituted polymers of the present invention to impart improved photoeffectiveness thereto or for imparting other desired film characteristics thereto. Examples of such photoactive structures which may be used include:

KETONES AND QUINONES

Acetone
Propiophenone
Xanthone
Phenyl cyclopropyl ketone
Di-isopropyl ketone
Acetophenone
1,3,5-Triacetylbenzene
Isobutyrophenone
4-Methylacetophenone
1,3-Diphenyl-2-propanone
4-Bromoacetophenone
3,5-Dimethylacetophenone
2-Acetylpyridine
3-Acetylpyridine
Triphenylmethyl phenyl ketone
Sodium Benzophenone-3-sulfonate
4-Acetylpyridine
3-Cyanoacetophenone
4,4-Dimethoxybenzophenone
4,4-Dimethylbenzophenone
4-Chloracetophenone
4-Methoxyacetophenone
Anthrone
4,4'-Dichlorobenzophenone
4-Trifluoromethylbenzophenone
4-Hydroxylbenzophenone
Pyruvic Acid
4-Acetylacetophenone
4-Aminobenzophenone
9-Benzoylfluorene
4-Cyanobenzophenone
Thioxanthone
4-Aminoacetophenone
Ethyl pyruvate
Phenylglyoxal
Anthraquinone
α-Naphthoflavone
Flavone
Ethyl phenylglyoxylate
4-Acetylbiphenyl
4,4-Diphenylcyclohexadienone
2-Benzoylbenzophenone
Benzophenone
Michler's Ketone [4,4'-bis-(dimethylamino) benzophenone]
β-Naphthyl phenyl ketone
β-Acetonaphthone
α-Naphthyl phenyl ketone
Ethyl naphthylglyoxylate α-Acetonaphthone
5,12-Naphthacenequinone
Biacetyl
Acetylpropionyl ($CH_3COCOC_2H_5$)
Benzil
Fluorenone
Camphorquinone
Phenanthrenequinone
3-Acetylpyrene
Thiobenzophenone

ALDEHYDES

Benzaldehyde
2-Hydroxybenzaldehyde
4-Chlorobenzaldehyde
3-Iodobenzaldehyde
2-Chlorobenzaldehyde
Acrolein
2-Naphthaldehyde
1-Naphthaldehyde
Glyoxal
9-Anthraldehyde

AROMATIC COMPOUNDS

Carbazole
Dibenzothiophene
Fluorene
Triphenylene
Phenanthrene
Quinoline
Naphthalene
1-Methylnaphthalene
Acenaphthene
1-Chloronaphthalene
1-Bromonaphthalene
1-Iodonaphthalene
Chrysene Coronene
1,2,5,6-Dibenzanthracene
1,2,3,4-Dibenzanthracene
Phenazine
Anthracene
Azulene
Pyrene
Pyrene-$d_{10}$
Pentaphene
1,2-Benzanthracene
11,12-Trimethylenetetraphene
1,12-Benzperylene
Acridine
3,4-Benzpyrene
Anthracene-$d_{10}$
Naphthacene

CONJUGATED AROMATICS AND OLEFINS

Phenylacetylene
2,4-Hexadiene-1-ol
1,3-Cyclohexadiene
trans-4-Nitrostilbene
trans-Stilbene
Diphenylacetylene
Cyclopentadiene
cis-Stilbene
1,4-Diphenyl-1,3-butadiene
trans,trans-1,3,5-Hexatriene
1,3,5,7-Octatetraene

AROMATIC NITROGEN COMPOUNDS

Phenyl Azide
Benzonitrile
$C_8H_5CH=NC_6H_5$
Triphenylamine

PEROXIDES AND PEROXIDE COMPOUNDS

Lauroyl proxide
Acetyl peroxide
Benzoyl peroxide
t-Butyl peroxyisobutyrate
di-t-butyl diperoxyphthalate
Hydroxyheptyl peroxide
Methyl ethyl ketone peroxide
p-Menthane hydroperoxide
2,5-Dimethylhexane-2,5-dihydroperoxide
Di-t-butyl peroxide
Peracetic acid
Di-t-butyl diperphthalate
Caprylyl peroxide
2,4-Dichlorobenzoyl peroxide
p-chlorobenzoyl peroxide
t-Butyl peracetate
t-Butyl perbenzoate
Cyclohexanone peroxide
t-Butyl hydroperoxide
Pinane hydroperoxide
Dicumyl peroxide
Azobisisobutyronitrile
Hydrogen peroxide

MISCELLANEOUS

Sulfonyl halides
Halosulfonamides
Oximes
Hydrocarbon compounds with bromine and iodine
Haloamides
Haloimides
Diazos
Azides
Uranyl Salts
Diphenyl sulfide
Acridene yellow
Eosin
Erythrosine
Sodium triphenylene-2-sulfonate
2-Napthoic acid
Fluorescein
Crystal Violet
Benzamide
Benzonitrile
Disodium naphthalene-2,6-disulfonate
1-Naphthoic acid
Azure B
Azure C
Basic Fuchsin
Eosin Y
Biacetyl Monoxime Ethyl Carbonate
Benzophenone Oxime Ethyl Carbonate
Biacetyl Monooxime Phenyl Ester
Benzophenone Oxime Acetyl Ester
2,3-Butanedione-O-vinylbenzoyloxime
Diacetyl
Diphenyltriketone
Phenylglyoxal
α-phenylbenzoin
2-oxopropylene bis (methyl xanthene)
ethyl-2-benzothiazylsulfonate
Benzenesulfinic acid, sodium salt
Benzoin isopropyl ether
Boron trifluoride methanol complex
n-butyl-4-bis(tert-butylperoxy)valerate
Cerium 2-ethylhexanoate
Cobalt naphthenate
p-dimethylaminobenzaldehyde
Cinnamyl cinnamate
Biacetyl monooxime phenylurethane
Biacetyl monooxime acetyl ester
Benzophenone oxime phenyl ester
2,3-butanedione-O-methacryloyloxime
2-propanone-O-methacryloyloxime dibenzoyl
pentanedione-2,3
α-methylbenzoin
p-methoxybenzene thiol
Carboxymethyl-N,N-dimethyl-dithiocarbamate
Tetramethylthiuram disulfide
Ascorbic acid
Boron trifluoride etherate
Boron trifluoride monoethylamine complex
Carbazole
Copper Naphthenate
Sulfur trioxide-trimethylamine complex
n-vinylcarbazole
Magdala Red
Methylene blue chloride
Erythrosin B
Malachite green oxalate
Methylene violet
Methyl violet 2B
Rhodamine B, 5G
Sulfo Rhodamine B extra
Tetrabromophenol blue
Victoria green
Thionin
1,2-benzanthroquinone 5-nitroacenaphthene
Bromal
Tetrabromopyrrole
p-azidocinnamate
Triphenylphosphone
2,4,7-nitro-9-fluorenone
Chloral
Carbon tetrachloride
Benzotriazole
Thio michlers ketone
Triphenylphosphine oxide
Triphenyl phosphite
N-nitrosoacetoacetanilide
Quinone diazides
Polyvinylcinnamate
Dioxane . SO$_3$ complexes
N-nitrosocaprolactam
Nitrophenyl acetic acids and their salts
Cinnamate polymers
Triethylphosphite . SO$_3$ complexes Carbonyl azide polymers, sulfonyl azide polymers, condensation products of p-diazodiphenylamine and aldehydes, N,N-diethylaminophenyldiazonium salts, acetylenic alcohols such as 2-ethylhexynol, propargyl alcohol and their esters, Surfynol surfactants supplied by Airco and their esters, adipicdihydrazide, spiropyran and other photochromic dyes such as:

1,3,3-tirmethyl-6'-nitrobis (indoline-2,2'-benzopyran)
1,3,3,5-tetramethyl-6'-nitrospiro(indoline-2,2'-benzopyran)
1,3,3-trimethyl-5-chloro-6'-nitrospiro(indoline-2,2'-benzopyran)
1-y-carboethyoxypropyl-3,3-dimethyl-6'-nitrospiro(indoline-2,2'-benzopyran)
1,3,3-trimethyl-6'-nitro-8'-methoxyspiro(indoline-2,2'-benzopyran)
1,3,3-trimethyl-5-methoxy-6'nitrospiro(indoline-2,2'-benzopyran)
18-carboxyethyl-3,3-dimethyl-6'-nitrospiro(indoline-2,2'-benzopyran)
1-y-cyanopropyl-3,3-dimethyl-6'-nitrospiro(indoline-2,2'-benzopyran)

These compounds, oligomers and polymers may enhance the performance of the base aromaticglyoxy polymer by changes in spectral response. They or their counterparts may be used with the polymer or with the polymer and an unsaturated species. Combination of two or more of these sensitizers may be advantageously employed. For example, benzoin and Michlers ketone, benzophenone and thio Michlers Ketone, benzophenone and triethanolamine, etc. Any single species or combination may be used as long as the storage stability, due to premature decomposition, is not affected. Certain of these compounds and even solvents are believed to have ordering as well as plasticizing effects which are beneficial. By plasticizing, functional group or segment mobility is increased. Ordering results in more efficient photolysis. The aromatic ketones and diazo compounds as well as oligomer and polymers are particularly useful. Peroxides are similarly effective. The solubilization and cosolubilization of the aromaticglyoxy polymer with the sensitizers for purposes of film casting can be established by solubility parameter matching. Often dispersions, colloidal dispersions or emulsion are sufficent for film formation.

The unsaturated materials which advantageously can be combined with the aromatic glyoxy polymers of this invention may be defined as any monomer, oligomer or polymer having a single or multiple carbon to carbon unsaturation which is capable of contributing to the formation of an insoluble film when present with these aromaticglyoxy polymers. As such, these unsaturated material may be generally represented by the following structural formula:

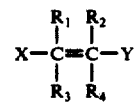

wherein X, Y, $R_1$, $R_2$, $R_3$, and $R_4$ may be hydrogen, alkyl aryl, halo, acetyl, carbonyl, carboxy, carboxy ester, amide, sulfonyl, solfonyl ester or amide, sulfonic, phosphonyl, phosphoryl and the esters and amides thereof. X, Y, $R_1$, $R_2$, $R_3$, and $R_4$ may be the same or different. X and Y additionally may be polymeric or they may be sites from which an unsaturated structure is pendant. Preferably, the species are liquids or solids. Normally gaseous species are acceptable only if they can be complexed to prevent losses in the cast films.

The preferred unsaturated materials which can be combined in photoreactive compositions with the aromaticglyoxy polymers of this invention are the polyfunctional, low molecular weight, acrylates and methacrylates such as, for example, trimethylolpropanetriacrylate, pentaerythritol triacrylate, pentaerythritol tetracrylate, neopentylglycol diacrylate, trimethylolpropane trimethacrylate, pentaerythritol trimethacrylate, pentaerythritol tetramethacrylate, dipentaerythritol monohydroxypentamethacrylate, tetramethylene diacrylate, 1,3-butylene diacrylate, 1,3-butylene dimethacrylate, diethyleneglycol diacrylate, diethyleneglycol trimethacrylate, acrylated epoxidized novalacs, methacrylated epoxidized novalacs, glyceryl triacrylate, glycerly trimethacrylate, bisphenol-a dimethacrylate, 2,2-dimethylolpropionic acid 2,2-dimethacrylate, ethylene diacrylate, ethylidene dimethacrylate, 1,6-hexamethylene diacrylate, 1-phenylethylene 1,2-dimethacrylate, 2,2',6,6'-tetrabromobisphenol-a dimethacrylate, 2,2,2-trichloroethylidene dimethacrylate, triethylene glycol dimethacrylate, 1,4-cyclohexanedimethyl dimethacrylate, diisopropylene glycol dimethacrylate, dodecahydrobisphenol-a dimethacrylate, ethylidene diacrylate, 1,6-hexamethylene dimethacrylate, neo-pentyl glycol dimethacrylate, tetraethylene glycol dimethacrylate, 1,1,1-trimethylol ethane trimethacrylate, pentamethylene 1,5-dimethacrylate, 1,2-propylene dimethacrylate, 2,2-dimethylolpropionic acid 2,2-diacrylate, and 2,2',6,6'-tetrachlorobisphenol-a dimethacrylate.

Other suitable unsaturated materials which may be used with the aromatic glyoxy substituted polymers in the photoreactive compositions of this invention include:

4-acetoxystyrene
Allyl lactate
4-benzylstyrene
4-tertiary-butylstyrene
4-cyclohexylstyrene
Diacetone Acrylamide
Diallyl Methyltartronate
1,4-dicyanobutene-2
2-(dimethylamino) ethyl vinyl ether
2-ethylhexyl alpha-cyanoacrylate
Glyceryl triacrylate
Hexadecyl methacrylate Methacroylacetone
2-methoxystyrene
Aconitic acid esters
N-allylindole
Allyl oxetyl ether
2-butene-1,4-dicarboxylic acid
2-chlorovinyl methyl ether
Decyl acrylate-acrylonitrile (50—50 Copolymer)
2,2-diallybutyraldehyde diallyl acetal
3,4-dichlorostyrene
N-(1,1-dihydroheptafluorobutyl) acrylamide
3-dimethylaminostyrene
Fluorostyrenes
Hexadecyl acrylate
Lead dimetharcrylate
3-methoxystyrene
Sodium acrylate
Allyl acrylate
n-amyl acrylate
Beta-benzoylacrylic acid
Bicyclo (2.2.1) 5-heptane-2-methyl methacrylate
2-n-butoxyethyl acrylate
2-chloroacrylonitrile
Cinnamyl acrylate
Beta-cyanoethyl acrylate
Cyclopentyl methacrylate
2,3-dibromopropyl methacrylate
N,N-diethylaminoethyl Acrylate
N,N-dimethylaminoethyl acrylate
2-ethoxyethyl acrylate
Ethyl alpha-chloroacrylate
2-ethylhexoxyethyl acrylate
(Ethoxymethylene) malononitrile
2-Furfurylacrylic acid
n-heptyl acrylate
n-lauryl acrylate
Methacrylyl chloride
2-methoxyethyl acrylate
n-octyl acrylate
Pentamethyl disiloxanemethyl methacrylate
Phenyl acrylate
Propargyl acrylate
Iso-propyl acrylate
3,5,5-trimethylhexyl acrylate
Allylacetic acid
n-allylacrylamide
Acrylyl chloride
Allyl methacrylate
Iso-amyl acrylate
Benzyl acrylate
2-bromoethyl acrylate
Tertiary-butylaminoethyl methacrylate
2-chloroethyl acrylate
Crotyl acrylate
Cyclohexyl acrylate
n-decyl methacrylate
Diethyl (ethoxymethylene) malonate
N,N-diethylaminoethyl methacrylate
N,N-dimethylaminoethyl methacrylate
Ethyl alpha-bromoacrylate
2-ethylbutyl acrylate
2-ethylhexyl methacrylate
Furfuryl acrylate
Furfuryl methacrylate
N-hexyl acrylate
Methacrylonitrile
3-methoxybutyl acrylate
Octadency acrylate (pure)
Pentabromophenyl methacrylate
2-phenoxyethyl acrylate
2-phenylethyl acrylate
N-propyl acrylate
Tetrahydrofurfuryl acrylate
Tridecyl acrylate (mixed isomers)
Undecyl acrylate
Allylacetone
Allyl acrylate
Allyl anthranilate
Allyl bromoacetate
2-allylbutyraldehyde
Allyl chloroacetate
Allyl cinnamate
Allyl diglycolcarbonate
Allyl formate
Allyl iodide
Allyl laurate
Allylmethacrylate
N-allylmorpholine
4-allyloxybenzaldehyde
Allyloxy-2-vinyloxyethane
Allylphenyl allylphosphonate
N-allylpyridinium bromide
Allyl trichloroacetate
Allyl trifluoroacetate
Allyloxy-2,2-di (hydroxymethyl) butane
N-2(2-chloroallyl) morpholine
1-chloro-5,5,7,7-tetramethyloctene-2
N,N-diallylacrylamide
N,N-diallylaminoacetonitrile
Diallyl carbonate
Diallyl 1,4-cyclohexanedicarboxylate
1,12-diallyl dodecadionate
Diallyl fumarate
Diallyl homophthalate
N,N-diallylmethacrylamide
1,4-di(allyloxy)butene-2
1,3-di(allyloxy)-2,2-di(hydroxymethyl) propane
Diallyloxymethane
Allylbenzene
Allyl 2-bromobutyrate
Allyl Caprylate
Allyl 4-chlorophenyl ether
Allyl cyanide
Allyl ether
Allyl hydroxyethyl ether
Allyl isocyanate
Allyl methacrylamide
4-allyl-3-methoxyphenol
Allyloxyacetate, vinyl ether
2-allyloxypropionitrile
Allyl palmitate
Allyl propionate
Allyl thiourea
Allyl trichlorosilane
Allyl vinyl ether
N-(2-chloroallyl) piperidine
Diallyl
Diallyl adipate
Diallyl Azelate
Diallyl chlorendate
Diallyl diglycolate
Diallyl ether
Diallyl glutarate
Diallyl isocyanurate
Diallyl oxalate
1,2-di(allyloxy) ethane Diallyloxymethane
Diallyl iso-phthalate
N-methyl acrylamide
N-methyl methacrylamide
N-(1-naphthyl) methacrylamide
N-iso-propylacrylamide
N-phenylmaleamic acid
N,N,N',N',-tetrabutylfumaramide
N,N,N',N',-tetraethylfumaramide
N-(3-trifluoromethylphenyl) methacrylamide
Divinylbenzene
2-(4-methylpentenyl-3) butadiene-1,3
Acrylate, magnesium
Acrylic anhydride
Allyl methacrylate
Divinyloxymethane
Hydroxypropyl methacrylate
N,N'-methylene-bisacrylamide
N,N-methylene-bis-acrylamide
N-(1-naphthyl) acrylamide
N-octadecylmethacrylamide
N-phenylacylamide
N-phenylmethacrylamide
N,N,N',N'-tetrabutylmaleamide
N,N,N',N'-tetraethylmaleamide
Dicyclopentadiene (cyclopentadiene dimer)
Hexachlorobutadiene-1,3
Acrylate, calcium
Acrylate, zinc
Allyl acrylate
Allyl methacrylamide
Diallyloxy compounds
Ethylene glycol monomethacrylate
1,6-hexamethylene-bisacrylamide
Methacrylic anhydrice
Tetraallyl compounds
2-methylstyrene
Methyl vinyl carbinol
Methyl vinyl ether-maleate half-ester copolymer
1,1,2,2,-tetraalyoxyethane
Alpha, beta, beta-trifluorostyrene
Vinyl 4-tertiary-butylbenzoate
N-vinylcaprolactam
1,-vinyl-1-cyclohexene
Vinyl decyl ether, monomer and polymer
Vinyl ethyl ether, polymer
1-vinylimidazole
Vinyl 4-methoxybenzoate
Vinyl 2-naphthoate
2-acetaminoacrylic acid
Acrylic acid
Allylarsonic acid
Beta-benzoylacrylic acid
Crotonic acid
Diallylacetic acid
N,N-diethylmaleamic acid
Beta, beta-dimethylacrylic acid
Fumaric Acid
2,4-hexadienoic acid
Methacrylic acid
Vinylacetic acid
Beta-methylstyrene
Methyl vinylacetate (Methul 3-butenoate)
Methyl vinyl ether-ammonium maleamate copolymer
N-tertiary-octylacrylamide
Phenyl vinyl ketone
Propylene Sulfide
Vinylacetyl chloride
Vinyl n-butyl ether
vinyl 3-chlorobenzoate
Vinyl cyclohexyl ketone
Vinyl dodecyl ether
Trans-vinylene diisocyanate
Vinyl lithium
Vinyl 1-naphthoate
Vinyl phenyl ketone
Acetylene dicarboxylic acid, mono-potassium salt
Allylacetic acid
2-allyloxypropionic acid
N-n-butylmaleamic acid
Cyanuric acid
N,N-di-n-butylmaleamic acid
Dihydroxymaleic Acid
N,N-Dimethylmaleamic Acid
N-Ethylmaleamic Acid
2-Furfurylacrylic Acid
Itaconic Acid
N-Phenylmaleamic Acid
2-Vinylpropionic Acid
Diallyl Phosphite
Diallyl Sebacate
Diallyl Succinate
Diallyl 2-3,4,6-Tetrabromophthalate
Diethyl Allyl-1-methylbutylmalonate
Dimethallyl
Dimethallyl Ether
3,3-Dimethoxypropene-1
Methallyl Acrylate
Methallyl Butyrate
Methallyl Methacrylate
2-Phenyl Allyl Alcohol
1,1,3,3-Tetraallyoxypropane
Tetraallyltin
Triallyl Aconitate
Triallyl Phosphate
Acrylamide
N-n-Butylacrylamide
N-n-Butylmaleamic Acic
N-tertiary-Butylmethacrylamide
N,N-Diallylmethacrylamide
N,N'-DI-n-butylfumaramide
N,N'-Di-n-butylmaleamide
N,N-Diethylacrylamide
N,N-Diethylmaleamic Acid
N,N-Diethylmethacrylamide
N,N-Dimethylmaleamic Acid
N,Dodecylmethacrylamide (N-Lauryl-methacrylamide)
N-Ethylmaleamic Acid
N-Hexadecylmethacrylamide
Methacrylamide
Diallyl Pimelate
Diallyl Suberate
Diallyl Sulfide
2,3-Dichloropropene
N,N-Diethyl-N'-allyl Thiourea
Dimethally Carbonate
Dimethallyl Maleate
N,N-Dimethylallylamine
Methallyl Alcohol
Methallyl Chloride
Methallyl Methyl Ether
2-Phenyl Allyl Chloride
Tetraallyl Pyromellitate
Triallyl Acetyl Citrate
1,2,3-Tri(allyloxy)-2-(hydroxymethyl) propane Triallyl Trimesate
N-Allylmethacrylamide
N-tertiary-Butylacrylamide
N-n-Butylmethacrylamide
N,N-Diallylacrylamide
N,N-Di-n-butylacrylamide
N,N-Di-n-butylmaleamic Acid
N,N-di-n-butylmethacrylamide
N,N'-Diethylfumaramide
N,N'-Diethylmaleamide
N,N-Dimethylacrylamide
N,N-Dimethylmethacrylamide
N-Ethyl Acrylamide
N-Ethylmethacrylamide
Hexamethylene-1,6-bisacrylamide
N-Methacrylato-5-methyl-2-oxazolidone
Vinyl Allyloxyacetate
Vinyl Methacrylate
Allyl Trifluoroacetate
1,1-Dihydroperfluorobutyl Methacrylate
1,1-Dihydroperfluoroethyl Methacrylate
1,1,7-Trihydroperfluoroheptyl Acrylate
1,1,9-Trihydroperfluorononyl Acrylate
1,1,5-Trihydroperfluoropentyl Acrylate
1,1,3-Trihydroperfluoropentyl Acrylate
Vinyl Trifluoroacetate
Acrylic Anhydride
iso-Butenyl Methyl Ketone
3,3-Dimethoxypropene-1
2-Hydroxymethyl-5-norbornene (Bicyclo (2.2.1)helpt-5-ene-2-methanol
2-Hydroxypropyl Methacrylate
Methacrylic Anhydride
Vinyl Ethyl Ketone
N-Vinylphthalimide
4-Vinylpyridine
2-Vinylquinoline
Fumaryl Chloride
Vinyl Crotonate
1-Vinyloxy-2-allyloxyethane
1,1-Dihydroperfluorobutyl Acrylate
1,1-Dihydroperfluoroethyl Acrylate
N-(3-Trifluoromethylphenyl) methacrylamide
1,1,7-Trihydroperfluoroheptyl Methacrylate
1,1,9-Trihydroperfluorononyl Methacrylate
1,1,5-Trihydroperfluorononyl Methacrylate
1,1,3-Trihydroperfluoropropyl Methacrylate
Acrolein
2-Butene-1,4-diol
Diethyleneglycol mono-Methacrylate
2-hydroxypropyl Acrylate
Methacrolein
Methyl Vinyl Ketone
5-Vinyl-2-methylpyridine
2-Vinylpyridine
1,Vinyl-2-pyrrolidone
2-Ethylhexanoate, Cadmium
p-Bromostyrene
1,5,9-Cyclododecatriene
Decene-1
2,6-Dimethylheptenes
Divinyl Benzene (55%)
4-Ethoxystyrene
Heptenes
Hexadecene-1
Hexenes
Isoprene (High purity)
Methylbutenes
Methylpentenes
alpha-Methylstyrene
beta-Nitrostyrene
Norbornene
Phenyl Acetylene
Piperylene
4-iso-Propylstyrene
Tetradecene-1
9-Vinyl Anthracene
4-Vinylbiphenyl
2,5-Dimethyl-2,5-di(tertiary-butylperoxy) hexyne-3 (45% active, inert filler)
beta-Bromostyrene
2,3, or 4-Chlorostyrene
Cyclododencene
2,5-Dichlorostyrene
2,5-Dimethylhexadienes
Dodecene-1
Heptene-1
Hexachlorobutadiene
Hexadiene-1,5
Indene
4-Methoxystyrene
Methylcyclopentadiene Dimer
2-(4-Methylpentenyl-3)butadiene-1,3
4-Methylstyrene
p-Nitrostyrene
Octadiene-1,7
1-Phenylbutene-2
iso-Propenyl Acetylene
Styrene Sulfonate, Sodium Salt
Trimethylpentenes
5-Vinylbicyclo (2.2.1) heptene-2
Vinylcyclohexane
Vinylindane
Vinyl Naphthalenes
vinyloxy-2-allyloxyethane
Vinyl trimethylnonyl ether
2-vinylmesitylene
Vinyl toluene (mixed isomers)
Vinyl triethoxysilane
maleic anhydride butadiene polymers
Polybutadienes
Polyisoprene
Polychloroprenes
Polysiloxane polymers with pendant unsaturations
Urethane polymers with backbone or pendant unsaturation
Alkyd resins and other polyesters with residual unsaturations such as fumaric acid butane diol polymers
Allyl acrylate polymers
Acrylayed or methacrylated: polyvinyl alcohol polymers; phenoxy resins; allyl alcohol polymers; cellulose; starches; inositol; hydroxyalkyl acrylate polymers; hydroxyalkyl methacrylate polymers; novolac resins; alkoxylated novolac resins; polyvinylamine polymers; epoxy resins; polythiols; polyvinylhydroxy aryl polymers; alkoxylated polyvinylhydroxy aryl polymers; allylamine polymers; imine polymers such as polyethylene imine, polypropyleneimine and deacetylated chitin The foregoing unsaturated materials may be used with the aromaticglyoxy substituted polymer or with both the aromaticglyoxy substituted polymer and the photosensitizers. Further, a mixture of two or more of these unsaturated materials may be advantageously employed with the aromaticglyoxy polymer or with the aromaticglyoxy polymer and a mixture of two or more sensitizers. Oligomeric acrylics are preferred unsaturated materials for use in the compositions of the present invention.

Additives such as, for example, pigments, dyes solvents, plasticizers, antihalation agents, adhesives, extenders, fillers, flow control agents, inhibitors, antioxidants, and other polymers may be used in the compositions of the present invention provided that they not adversely affect the compositions. Solvents used therein may be water based, organic or a mixture of both. Likewise, conventionally known plasticizers may be employed in these compositions such as phthalate esters, adipates, phosphates, and the like.

As previously indicated, the novel polymers of the present invention can also function as sensitizers, that is, they exhibit a property of absorbing light and transferring energy to the photosensitive material associated therewith to provide increased photosensitivity in a given photosensitive or photoreactive composition. As such, these photosensitizers can be used alone or in conjunction with other known sensitizers. Examples of additional sensitizing agents which can be used in conjunction with the compositions of this invention include Michler's ketone, picric acid, 2,4,6-trinitrobenzoic acid, 1,2-benzanthraquinone, 2,5-diphenyl-p-quinone, 4,4-tetraethyl diamino diphenyl ketone, 4,4'-tetraethyl diaminodiphenyl carbinol, 4,4-tetramethyl diamino benzophenone imide, 1-methyl-2 benzoylmethylene-beta-naphthothiazoline, 4,4-diazodistilbene-2,2'disulfonic acid, and auramine base. Other sensitizers ehxibiting similar properties and characteristics which may be used in conjunction with the photosensitizers of the present invention will be apparent to those skilled in this art. In this regard, it should be noted that the photoreactive coating compositions of the present invention do not require the addition of other sensitizers such as those identified above in order to exhibit satisfactory sensitivity.

In general, it has been found that when the photoreactive materials of the present invention are used in photosensitive coatings which include a monomer such as a vinyl or acrylic monomer that an antioxidant such as, for example, 2,6-di-tert-butyl-p-cresol or p,p'-biphenol also can be advantageously employed therewith.

It has been found that the composition of the present invention is also quite stable if stored away from light, however, in certain instances it may be desirable to include a small quantity of a polymerization inhibitor, such as, for example, hydroquinone, which is sufficient to maintain the stability of the composition but insufficient to prevent, or materially affect, polymerization when the composition is later exposed to actinic light.

In preparing products made with the polymers of the present invention, such as, for example, lithographic plates, a solution of these novel aromaticglyoxy substituted polymers alone, or in conjunction with other thermoplastic resins, photoinitiators, photosensitizers, and other optional constituents, is applied to a support for backing member in any manner such as spraying, whirler coating, and the like after which the solvent is evaporated either by air drying or heating to produce a thin film on the support member. Typically, the support member may comprise any rigid substrate and will be characterized by a surface which is hydrophilic and to which the film or coating of the photoreactive composition will adhere. Class, paper, resin impregnated or reinforced paper, solid resinous sheets, or metal plates, such as aluminum, zinc, magnesium or copper having a coating providing the desired properties and characteristics may be used as the material of construction in the support member. In addition, the support member may be in plate, sheet or foil form and may be smooth or grained. For example, in the case of an aluminum plate backing member, the surface thereof may be anodized and treated with an aqueous alkali metal silicate, silicic acid or equivalent which provides the metal with a hydrophilic surface. Likewise, if desired, the base plate or backing member may be provided with a resinous coating which is adapted to receive the light sensitive coating material. Exemplary of resinous coatings of this type are those fully described in U.S. Pat. Nos. 3,073,723, 3,161,517 and 3,232,738.

It will be appreciated that the precise composition of the photosensitive coating solution will be variable to a considerable extent, with the usual requirement being that there be a sufficient amount of photoreactive materials in the solution to deposit a resultant coating on a backing member which will be able to provide an image area which possesses the desired coating thickness and toughness. In general, solvent solutions containing approximately $\frac{1}{2}$% by weight to 10% by weight of the active photoreactive constituents have been found to be suitable for most purposes, including the production of presensitized lithographic plates. Preferably, the concentration of the aromaticglyoxy substituted polymer of the present invention and other thermoplastic resins which may be included therewith will be approximately 2% by weight based on the total weight of the solution. If additional photoinitiators or photosensitizers are used, the concentration thereof will usually range from about 0.1% to 20% by weight based on the weight of the other photoreactive constituents.

After the backing or support member has been coated with a film which includes the photoreactive materials of the present invention, it is dried and can be stored for extended periods of time until ready for use. If desired, heat may be used to insure that the residual solvent is driven off for the purposes of facilitating photoinsolubilization when the lithographic plate is exposed to a controlled actinic light source.

In use, the photosensitive coating is exposed to a controlled actinic light source, preferably a mercury lamp with a strong light output of between 250 and 500 nm. It will be appreciated, however, that a wide range of different light sources may be used, depending upon the particular structure of the photoreactive composition and whether or not additional sensitizers and/or initiators are used in conjunction therewith. The exposure to light is done through a stencil, negative, template or pattern to produce a desired light exposure or image area on the surface of the photoreactive coating. This exposure results in a photoinsolubilization within the coating at those locations which receive the light. The duration of exposure is, or course, widely variable depending upon the intensity and type of the light source, the precise composition of the coating, the thickness of the film, and the like. The unexposed areas remain soluble, thereby enabling the image to be solvent developable. In instances wherein water soluble photoreactive compositions are employed, the non-exposed areas can be washed away with a suitable water or alcohol based solution. The plate can then be desensitized in accordance with known techniques.

The exposed lithographic plate, if desired, may be developed through the use of any emulsion developer of the type well known in the art which causes the exposed surface underlying the light exposed photoreactive coating areas to be hydrophilic and the light exposed photoinsolubilized areas to become oleophilic in a single operation. Such developers eliminate the necessity of subsequently desensitizing the plate after development.

While not necessary, if desired, the coated plate may then be subjected to baking to increase further the strength of the insoluble polymeric image area. For example, the coating composition and support member may be oven baked at a temperature below the softening temperature of the support member, for example, below about 150° C. when an aluminum plate is used as the backing member. Also, a UV "bump" postexposure may be used.

It should be noted that while the foregoing description of a specific application of the materials of the present invention has been directed to the manufacture of lithographic plates, these novel compositions may be likewise advantageously used in other photochemical and photomechanical processes such as, for example, other printing processes, the preparation of etched electrical circuits, chemical milling and the like as well as in the preparation of photocurable inks and coatings which, for example, can be of a decorative or protective nature.

A preferred method for preparing the photoreactive composition of the present invention involves the glyoxylation of recurring aromatic groups in polymers. Preferably this glyoxylation involves Friedel-Crafts glyoxylation by reaction oxalyl chloride in the presence of an anhydrous aluminum trichloride catalyst of a polymeric backbone structure which typically includes from 5 to 10,000 repeating monomeric units. The degree of glyoxylation, however, need not be complete. For example, glyoxylation of from 20 to 80 percent of the aromatic groups present in the backbone structure provides compositions which are eminently satisfactory.

The following examples are offered to illustrate the photoreactive compositions of the present invention and products made therewith.

EXAMPLE 1

Part 1 — Preparation of Poly (phenylglycidylether)

In a resin kettle equipped with condenser, stirrer, nitrogen inlet is placed 200 milliliters of xylene, 14.7 g. (.06 moles) glycerol-1,3-diphenyl ether, phenylglycidylether (270.4 grams or 1.8 mols), and powdered potassium hydroxide (0.65 grams or about 0.2% of the total charge). A slight flow of nitrogen is maintained during the entire reaction. The mixture is heated rapidly to about 110° to 120° and held there for several hours and then heated up to the reflux temperature or about 145° C. Then the condenser is reversed and the xylene is distilled off of the reaction mixture. The remaining reaction mixture is heated slowly to 160° C. with continued nitrogen flow and vacuum is applied to remove any excess phenylglycidyl ether remaining behind in the polymer. The reaction mixture is cooled and poured into a jar. The yield of polymer is nearly quantitative. The polymer is used without further purification. This polymer has a theoretical degree of polymerization of about 30 since an excess of 30 mols of phenylglycidylether was used over that of the glycerol-1,3-diphenyl ether.

Part 2 — Preparation of Poly(p-glyoxy phenylglycidylether)

In a resin kettle equipped with a motor driven stirrer, nitrogen inlet, condenser and gas outlet, 250 milliliter addition funnel and thermometer, is placed 300 milliliters of dry nitrobenzene and 26.6 grams or .18 equivalents of poly(phenylglycidylether). The apparatus is flushed with nitrogen gas and the reaction vessel is cooled with ice and 25 grams or 0.18 mols of ethyl oxalyl chloride is added. In the addition funnel is placed a solution of 39 grams or 0.29 mols of anhydrous aluminum chloride dissolved in about 120 milliliters of nitrobenzene. The flow of dry nitrogen gas is maintained throughout the reaction. The reaction kettle is then cooled down to 0° to 5° C. and the addition of the aluminum chloride solution is started. The solution is added over a period of about 20 minutes with continued stirring. After completion of the addition of the aluminum chloride solution, the reaction mixture is allowed to warm slowly to room temperature. Shortly after the addition is complete, the mixture thickens up to a soft gel but stirring is maintained for the remainder of the day and is then discontinued overnight. The following day the gel-like reaction mixture is dropped in small portions into a mixture of ice and dilute hydrochloric acid with vigorous stirring. The resulting solution is then steam distilled to remove all the nitrobenzene. Ethyl acetate is then added to the warm solution remaining after the steam distillation to dissolve the suspended polymer. When the polymer is completely dissolved, the solution is then placed in a separatory funnel and the two layers are separated. The aqueous layer is then extracted with two more portions of ethyl acetate,. The combined ethyl acetate extracts were dried over anhydrous sodium sulfate, the aqueous layer was then discarded. The ethyl acetate is filtered to remove the sodium sulfate drying agent and then a solution of 80% saturated sodium bicarbonate is added and these are stirred together vigorously. The solution is poured into a separatory funnel and the aqueous layer separated from the ethyl acetate layer. The ethyl acetate layer is then washed with two more portions of sodium bicarbonate solution. The combined sodium bicarbonate solutions are then vacuum evaporated to remove all the ethyl acetate. The aqueous solution is then cooled with ice, and hydrochloric acid is added in sufficient quantity to bring the pH to 1 thus precipitating the polymer from the aqueous solution. The polymer is filtered off, washed repeatedly with deionized water and dried. The yield of polymer was 27.4 grams having a neutralization equivalent of 294. From this it can be calculated that the percent of glyoxylation was 67% and the yield of polymer from the reaction was 78% of the theoretical.

EXAMPLE 2

Solutions A, B and C, respectively, were prepared by admixing ingredients as set forth in Table I.

TABLE I

|  | Styrene Monomer | Methanol | PGEPGA |
|---|---|---|---|
| Solution A | 2 gr. | 2 gr. | None |
| Solution B | 2 gr. | 2 gr. | 0.2 milligrams |
| Colution C | None | 4 gr. | 0.2 milligrams |

As used here, PGEPGA denotes poly(p-glyoxy phenylglycidylether), the light sensitive polymer prepared in Example 1.

Nitrogen gas was bubbled through these three solutions and then they were irradiated for twenty minutes with a black light fluorescent lamp. Only in solution B did any precipitate, indicating polymerization of styrene, become evident.

EXAMPLE 3

Solutions D, E and F, respectively, were prepared by admixing ingredients as set forth in Table II.

TABLE II

|  | Styrene Monomer | Methanol | PGEPGA |
|---|---|---|---|
| Solution D | 1 gr. | 2 gr. | None |
| Solution E | 1 gr. | 2 gr. | 0.1 gr. |
| Solution F | None | 3 gr. | 0.1 gr. |

Solutions D and E were irradiated as in Example 2 for 150 minutes. In Solution D there was no indication of any formation of polystyrene. In Solution E precipitate formed was collected and analyzed and found to be essentially polystyrene. Solution F was irradiated without nitrogen flushing and a yellow precipitate formed. Since no styrene was present, only the photopolymer was crosslinked in this case.

EXAMPLE 4

One gram of polymer prepared in Example 1 was dissolved in 25 grams of acetone and 24 grams of methylethyl ketone to make a coating solution. This solution was flow coated on a brush grained aluminum plate previously treated to render the surface hydrophilic and was allowed to drain and dry at room temperature, then for several minutes in a warm oven. The resulting plate was then exposed for 8 minutes on a Nuarc FT 40 Flip-Top Platemaker with a pulsed xenon light source having 4,000 watts input power to the lamp through a negative. The exposed plate was then developed merely by swabbing it with a standard lithographic desensitizer and then gumming it with a standard gum asphaltum etch. The plate was then mounted on a printing press. Plate exposure was such that 7 solid steps printed on a lithographic sensitivity guide. Printing was continued until the first evidence of image wear which occurred on a 300 line 20% screen after 38,000 impressions.

EXAMPLE 5

A coating solution was prepared by dissolving 0.33 grams of PGEPGA, the polymer of Example 1, three grams of a high molecular weight polymethylmethacrylate resin, 29 grams of 2-ethoxyethyl acetate, 29 grams xylene, 39 grams of acetone. Using this as a coating solution, a lithographic plate was prepared as given in Example 4. This plate was exposed for 8 minutes and was developed with a developer composed of 70 parts by volume of standard lithographic desensitizer, 29 parts by volume of 2 ethoxyethyl acetate, and 1 part by volume of an emulsifying agent. The resulting plate ran for 10,000 impressions on the printing press before showing any signs of wear.

EXAMPLE 6

A coating solution was prepared by dissolving 6 grams of a high molecular weight polymethylmethacrylate resin and 4 grams of PGEPGA, the polymer of Example 1, in 57 grams of 2 ethoxyethyl acetate, 57 grams of xylene and 76 grams of acetone. A lithographic plate was prepared from this coating composition by the same procedure as given in Example 4. The plate was exposed as before for 8 minutes and developed with the same developing composition was was given in Example 5. This plate ran over 37,000 impressions on the press before showing any signs of wear.

EXAMPLE 7

An unsaturated polyester resin was prepared by standard polycondensation techniques from 2 parts of maleic anhydride; one part phthalic anhydride and 3 parts of 1,2-propanediol. A coating solution was prepared containing 6 grams of this polyester resin, 4 grams of the polymer of Example 1, and 57 grams of acetone. From this coating composition a lithographic plate was prepared and exposed as given in Example 4. After exposure the plate was developed with an emulsion developer composed of, in parts by volume, 69 parts of lithographic desensitizer, 30 parts of 2-ethoxyethyl acetate and 1 part of an emulsifying agent. This plate was run on a lithographic press concurrently with the plate of Example 4 and ran over 36,000 impressions before image failure showed up on a 300 line, 20% dot screen.

EXAMPLE 8

A small quantity of the polymer of Example 1 was slurried in water. Dilute sodium hydroxide was added to adjust the pH to 7 to form the sodium salts of the acidic polymer. Water was then added to adjust the polymer concentration to about 5%. This solution was coated on a brushed grained aluminum plate as described in Example 4. The plate was exposed to the light from two 15 watt black light fluorescent lamps at 2 inches for about 30 minutes. The resulting hardened film could not be removed by vigorous rubbing with water, ethyl alcohol or acetone. The second plate was coated with a 2% acetone solution of the polymer of Example 1. The resulting coated plate was exposed to an ammonia vapor for about 5 minutes to convert the acidic polymer to its ammonium salt. The plate was exposed as above and found to be similarly resistant to solvent.

EXAMPLE 9

A printed circuit is prepared as follows: 5% solution of the polymer of Example 1 in acetone was coated on the copper clad side of a copper clad phenolic laminate board having a 1.4 mil thickness of copper. The coated board was exposed for 8 minutes to the exposure device described in Example 4 through a suitable photographic negative. The exposed board was then developed with 5% aqueous sodium bicarbonate solution to remove the polymer which had not been light hardened. The bare copper that was thus exposed by the development process was etched away in a 40% aqueous ferric chloride solution in 18 minutes to produce an excellent replica of the original photographic negative. The etching resist was removed from the remaining copper by swabbing the board with a dilute solution of sodium silicate, having a pH of about 11.

EXAMPLE 10

This example illustrates the use of the polymer of Example 1 as a metal protective coating.

Part A

An aluminum lithographic plate was coated with a solution consisting of 3 grams of a high molecular weight polymethylmethacrylate homopolymer, 2 grams of the polymer of Example 1, and 55 grams of acetone. Two 3 by 5 inch sections were cut from this plate after it was coated and weighed on an anylitical balance. One of the plates was exposed for 30 minutes to the light from two 15 watt black light fluorescent lamps. The exposed plate was immersed for two and a half hours in warm acetone, dried and reweighed and found to have lost only 4 milligrams of its total coating weight. From the unexposed sample, it was determined that the total coating weight of 3 by 5 inch plate was 89 milligrams. Therefore, only about 5% weight loss was sustained on the exposed plate.

Part B

A piece of brass sheet was partially coated with a 2% solution of the polymer of Example 1 and exposed 8 minutes to the xenon arc described in Example 4. This coating protected brass from any etching by concentrated hydrochloric acid for 20 minutes, whereas the uncoated area of the brass plate was etched. This protective coating also prevented brass from being etched by 40% ferric chloride for 3 minutes whereas the uncoated area was quickly discolored. Similarly, an exposed coating of a 10% solution of the polymer of Example 1 on the brass completely protected brass from any etching during a 15 minutes exposure to 40% ferric chloride. The coating also protected the brass from attack by 10% nitric acid for about 15 minutes.

Part C

A steel coupon partially coated with both 2% and 10% solutions of the polymer of Example 1 and the resulting coated and exposed plate was partially immersed in a vigorously stirred hot salt solution for an hour. The uncoated area was significantly attacked by the salt solution but the coated areas were not attacked.

Part D

A 2% solution of the polymer of Example 1 was coated on a piece of aluminum sheet metal. This coating after exposure substantially protected the aluminum from etching by a composition composed of 5 grams of ferric chloride, 5 grams of cuprous chloride, 25 grams of concentrated hydrochloric acid, 75 grams of ethyl alcohol and 90 grams of water. This coating also forms a satisfactory resist type polymer for the etch and copperizing solution commonly used in the deep tech lithographic process.

EXAMPLE 11

A gravure type ink composition was prepared from 0.5 grams of phthalocyanine blue pigment, 0.7 grams nitrocellulose resin, and 0.8 gram of the polymer of Example 1. These were dissolved in 1.7 grams of ethyl alcohol, 0.5 grams of toluene and 2.8 grams of methyl ethyl ketone. The phthalocyanine blue pigment had been previously milled into nitrocellulose resin so no additional milling was necessary to give a good dispersion of pigment. This ink composition was drawn down on a metal plate into a thin film using a wire wound coating bar. Two such films were drawn down and one was exposed for 10 minutes on the xenon arc described in Example 4. The exposed sample had much greater solvent resistance to methyl ethyl ketone than the unexposed one. It had complete solvent resistance to ethyl alcohol whereas the unexposed portion of the sample had poor resistance to alcohol.

EXAMPLE 12

Phenyl vinyl ether is homopolymerized with boron trifluoride catalyst according to the method of I.P. Losev et al., *Journal of General Chemistry (U.S.S.R.)* 15, 353-357 (1945). The resulting polymer, after suitable purification, is then glyoxylated by the procedure given in Part 2 of Example 1, using 21.6 g. (0.18 mole) of the poly(phenyl vinyl ether) in place of the poly (phenyl glycidyl ether). A lithographic plate exhibiting satisfactory photospeed and wear properties is then prepared from the resulting glyoxylated polymer by the procedure given in Example 4.

EXAMPLE 13

2,6-dimethylphenol is polymerized by oxidative coupling to give poly(2,6-dimethyl-1,4-phenylene ether) by the procedure given in *Macromolecular Synthesis*, Volume 1, pp 75-76, C. G. Overberger, Ed.; John Wiley & Sons, Inc., New York, 1963. The resulting polymer is then glyoxylated by the procedure given in Part 2 of Example 1, using 21.6 g (0.18 mole) of the phenylene oxide polymer in place of poly(phenyl glycidyl ether). A lithographic plate exhibiting satisfactory photospeed and wear properties is then prepared from the resulting glyoxylated polyer by the procedure given in Example 4.

EXAMPLE 14

A photoreactive coating solution is prepared by combining 5 grams of the glyoxylated polymer of Example 12 together with 1 gram of trimethylolpropane triacrylate, 1 gram of XD-8031 (an acrylated expoxidized novolac resin marketed by Dow Chemical Company) and 95 grams of methyl isobutyl ketone and the thus formed solution used to produce a lithographic plate in accordance with the procedure described above in Example 4. The solution is characterized by improved coating characteristics and the plate with exceptionally increased in photospeed properties when compared with the Example 12 plate.

EXAMPLE 15

A photoreactive coating solution is prepared by combining 5 grams of the polymer of Example 13 with 1 gram of thimethylolpropane triacrylate, 1 gram of XD-8031 and 95 grams of methyl isobutyl ketone. The thus formed solution is used to produce a lithographic plate in accordance with the procedure described above in Example 4. As was the case with Example 14, the solution is characterized by improved coating charactertics and the plate by exceptionally increased photospeed properties when compared to the Example 13 plate.

EXAMPLE 16

This example illustrates the advantageous photospeed improvements imparted to the photoreactive compositions of the present invention when combined with trimethylolpropane triacrylate and an acrylated spoxy novolac such as XD-8031.

Photoreactive coating solutions were prepared from the constituents set forth below in the relative amounts indicated:

| | SAMPLE (Parts by weight) | | |
|---|---|---|---|
| | A | B | C |
| Polymer of Example 1 | 5 | 5 | 5 |
| Methyl isobutyl ketone | 90 | 90 | 90 |
| Isopropyl Alcohol | 5 | 5 | 5 |
| Trimethylolpropane triacrylate | 0 | 1 | 1 |
| XD-8031 | 0 | 0 | 1 |
| Steps after exposure (Stouffer 21 Sensitivity Guide) | 1 | 4 | 6 |

Lithographic plates were made by applying the above solutions on aluminum plates. These plates were then exposed for thirty seconds and developed as in Example 4. As the above data show, the photoreactive coating solutions of Samples B and C containing trimethylolpropane triacrylate and XD-8031 additives produced plates which were characterized by exceptionally significant improved photospeed properties when compared to the Sample A solution.

While the foregoing specification certain embodiments and examples of this invention have been described in detail, it will be appreciated that modifications and variations therefrom will be apparent to those skilled in this art. Accordingly, this invention is to be limited only by the scope of the appended claims.

We claim:

1. A light sensitive composition comprising a polymer which includes as a recurring structure:

wherein Ar is a bivalent aromatic radical and M is selected from the class consisting of hydrogen, alkali metal, ammonium and substituted ammonium.

2. The composition of claim 1 wherein said recurring structure is present in said polymer as pendant groups from the polymeric chain.

3. The composition of claim 1 wherein the

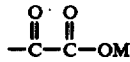

portion of said recurring structure is present in said polymer as pendant groups from the polymeric chain.

4. The composition of claim 1 wherein Ar is phenylene.

5. The composition of claim 1 wherein M is hydrogen.

6. The composition of claim 1 wherein Ar is phenylene and M is hydrogen.

7. The composition of claim 2 wherein said polymer chain includes as a recurring structure

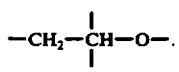

8. The composition of claim 1 wherein the polymer includes from 5 to 10,000 of said repeating units.

9. The composition of claim 1 in which said polymer includes recurring units having the formula:

$$-O-Ar-$$

wherein Ar is a bivalent aromatic radical and at least 10% of the Ar groups are glyoxylated.

10. The composition of claim 1 wherein said recurring units are attached to a backbone structure selected from the group consisting of aliphatic, aromatic, substituted aromatic, heterocyclic, metallocene, polyalkylene, polyalkylene oxide, polyester, polyurethane, polyamide, polysiloxane, polyalkylene imine, substituted polyalkylene, and phenolic derivatives.

11. The composition of claim 1 which contains an effective amount of said polymer together with a solvent selected from the group consisting of water and organic solvents.

12. The composition of claim 12 in which said effective amount is an amount sufficient to provide a concentration of said polymer in the range of 0.5 to 10 percent by weight based on the combined weight of the polymer and solvent.

13. The composition of claim 1 wherein an effective amount of said polymer is dispersed in a solvent together with a material selected from the group consisting of saturated resins, unsaturated resins and polymer precursors which material combines with said polymer to form a photoinsolublized product.

14. The composition of claim 13 wherein said material is dispersible in said solvent and is selected from the group consisting of acrylic polymers and copolymers, polyurethane resins, alkyl celluloses, epoxy resins, phenoxy resins, vinyl acetate/vinyl chloride copolymers, vinyl modified polyethylene, partially hydrolyzed vinyl acetate resin, phenolic resins, acrylamide and modified acrylamide polymers, water-soluble cellulose derivatives, and water-soluble polyether resins.

15. The composition of claim 13 wherein said material is a multifunctional, low molecular weight, acrylate or methacrylate.

16. The composition of claim 13 wherein said material is dispersible in said solvent and is selected from the group consisting of trimethylol propane triacrylate and acrylated epoxy novolac.

17. The composition of claim 1 wherein an effective amount of said polymer is dispersed in a solvent together with effective amounts of trimethylolpropane triacrylate and acrylated epoxy novolac.

18. The composition of claim 17 wherein Ar is phenylene and M is hydrogen.

19. The composition of claim 13 in which the polymer is present in an amount of at least 5 weight percent, based on the weight of the reactive material in the composition.

20. The composition of claim 1 wherein said polymer is present with a polymerizable monomer, the amount of said polymer ranging from approximately 0.01 to 10 weight percent, based on the total weight of reactive material in the composition.

21. The composition of claim 1 wherein said polymer is a glyoxyphenoxyethylene polymer.

22. The composition of claim 1 wherein said polymer is a glyoxynaphthyloxyethylene polymer.

23. A light sensitive composition comprising a polymer which includes as a recurring structure:

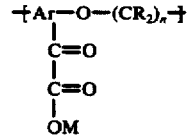

wherein R is selected from a group consisting of hydrogen, aryl, alkyl, halo, and aralkyl having up to 10 carbon atoms and n is from 0 to 18, Ar is a bivalent aromatic radical and M is selected from a class of hydrogen, alkali metal, ammonium and substituted ammonium.

24. The composition of claim 20 wherein n is one, Ar is phenylene, R is hydrogen and M is hydrogen.

25. The composition of claim 23 wherein said polymer is a glyoxylated phenylene oxide polymer.

26. A lithographic plate including a support member and a film formed from a photoreactive composition, said composition comprising a polymer which includes as a recurring structure:

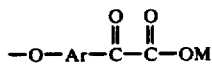

wherein Ar is a bivalent aromatic radical and M is selected from the class consisting of hydrogen, alkali metal, ammonium and substituted ammonium.

27. The lithographic plate of claim 26 wherein R is hydrogen, Ar is phenylene and M is hydrogen.

28. The lithographic plate of claim 26 wherein said recurring units are attached to a backbone structure containing repeating polyalkylene oxide units.

29. The lithographic plate of claim 26 wherein said polymer is a glyoxyphenoxyethylene polymer.

30. The lithographic plate of claim 28 wherein said recurring units are attached to a polyethylene oxide backbone.

31. The lithographic plate of claim 30 wherein the polyethylene oxide backbone has been 5 and 10,000 ethylene oxide repeating units.

32. The lithographic plate of claim 26 wherein an effective amount of said polymer is dispersed in a solvent together with a material selected from the group consisting of saturated resins, unsaturated resins and polymer precursors which material combines with said polymer to form a photoinsolublized product.

33. The lithographic plate of claim 32 wherein said material is dispersible in said solvent and is selected from the group consisting of acrylic polymers and copolymers, polyurethane resins, alkyl celluloses, epoxy resins, phenoxy resins, vinyl acetate/vinyl chloride copolymers, vinyl modified polyethylene, partially hydrolyzed vinyl acetate resin, phenolic resins, acrylamide and modified acrylamide polymers, water-soluble cellulose derivatives, and water-soluble polyether resins.

34. The lithographic plate of claim 32 wherein said material is a multifunctional, low molecular weight, acrylate or methacrylate.

35. The lithographic plate of claim 32 wherein said material is dispersible in said solvent and is selected from the group consisting of trimethylol propane triacrylate and acrylated epoxy novolac.

36. The lithographic plate of claim 32 wherein an effective amount of said polymer is dispersed in a solvent together with effective amounts of trimethylolpropane triacrylate and acrylated epoxy novolac.

37. A light sensitive composition comprising effective amounts of a photosensitizer and a polymer which includes as a recurring structure:

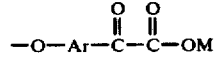

wherein Ar is a bivalent, an aromatic radical and M is selected from the class consisting of hydrogen, alkali metal, ammonium and substituted ammonium.

38. The composition of claim 37 wherein said recurring structure is present in said polymer as pendant groups from the polymeric chain.

39. The composition of claim 37 wherein the

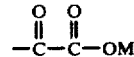

portion of said recurring structure is present in said polymer as pendant groups from the polymeric chain.

40. The composition of claim 37 wherein Ar is phenylene.

41. The composition of claim 37 wherein M is hydrogen.

42. The composition of claim 37 wherein said recurring units are attached to a backbone structure selected from the group consisting of aliphatic, aromatic, substituted aromatic, heterocyclic, metallocene, polyalkylene, polyalkylene oxide, polyester, polyurethane, polyamide, polysiloxane, polyalkylene imine, substituted polyalkylene, and phenolic derivatives.

43. The composition of claim 37 wherein said photosensitizer is present in an amount of from about 0.1 to 20 weight percent, based on the total weight of the reactive material in the composition.

44. A lithographic plate comprising a support member and a film formed from the light sensitive composition of claim 37.

45. A light sensitive composition comprising effective amounts of a photosensitizer, an unsaturated material selected from the group consisting of unsaturated monomers, unsaturated oligomers and unsaturated polymers, together with a polymer which includes as a recurring structure:

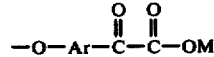

wherein Ar is a bivalent aromatic radical and M is selected from the class consisting of hydrogen, alkali metal, ammonium and substituted ammonium.

46. The composition of claim 45 wherein said recurring structure is present in said polymer as pendant groups from the polymeric chain.

47. The composition of claim 45 wherein said unsaturated material is a multifunctional, low molecular weight, acrylate or methacrylate.

48. The composition of claim 45 wherein the

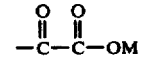

portion of said recurring structure is present in said polymer as pendant groups from the polymeric chain.

49. The composition of claim 45 wherein Ar is phenylene.

50. The composition of claim 41 wherein M is hydrogen.

51. The composition of claim 45 wherein said recurring units are attached to a backbone structure selected from the group consisting of aliphatic, aromatic, substituted aromatic, heterocyclic, metallocene, polyalkylene, polyalkylene oxide, polyester, polyurethane, polyamide, polysiloxane, polyalkylene imine, substituted polyalkylene, and phenolic derivatives.

52. The composition of claim 45 wherein said photosensitizer is present in an amount of from about 0.1 to 20 weight percent and said unsaturated material is present in an amount of from about 0.01 to 10 weight percent, based on the total weight of reactive material in the composition.

53. A lithographic plate comprising a support member and a film formed from the light sensitive composition of claim 45.

54. A photoreactive ink composition comprising a colorant and polymer which includes as a recurring structure:

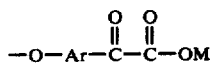

wherein Ar is a bivalent aromatic radical and M is selected from the class consisting of hydrogen, alkali metal, ammonium and substituted ammonium.

55. The ink composition of claim 54 wherein said recurring structure is present in said polymer as pendant groups from the polymeric chain.

56. The ink composition of claim 1 wherein the

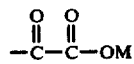

portion of said recurring structure is present in said polymer as pendant groups from the polymeric chain.

57. The ink composition of claim 54 wherein Ar is phenylene.

58. The ink composition of claim 54 wherein M is hydrogen.

59. A device for use in photochemical and photomechanical processes comprising a backing member and a film applied thereto, said film including a polymer having as a recurring structure:

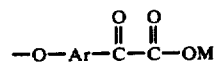

wherein Ar is a bivalent aromatic radical and M is selected from the class consisting of hydrogen, alkali metal, ammonium and substituted ammonium.

60. The device of claim 59 wherein said recurring structure is present in said polymer as pendant groups from the polymeric chain.

61. The device of claim 59 wherein the

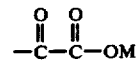

portion of said recurring structure is present in said polymer as pendant groups from the polymeric chain.

62. The device of claim 59 wherein Ar is phenylene.

63. The device of claim 59 wherein M is hydrogen.